US011989044B2

(12) United States Patent
Desmarais et al.

(10) Patent No.: US 11,989,044 B2
(45) Date of Patent: May 21, 2024

(54) DEVICE AND METHOD FOR HARVESTING ENERGY FROM A POWER LINE MAGNETIC FIELD

(71) Applicant: Aclara Technologies LLC, St. Louis, MO (US)

(72) Inventors: Richard Desmarais, Somersworth, NH (US); Richard Martyn, Somersworth, NH (US); Michael Giovannoni, Herndon, VA (US)

(73) Assignee: Aclara Technologies LLC, St. Louis, MO (US)

( * ) Notice: Subject to any disclaimer, the term of this patent is extended or adjusted under 35 U.S.C. 154(b) by 0 days.

(21) Appl. No.: 18/212,536

(22) Filed: Jun. 21, 2023

(65) Prior Publication Data
US 2023/0350440 A1 Nov. 2, 2023

Related U.S. Application Data

(63) Continuation of application No. 17/402,033, filed on Aug. 13, 2021, now Pat. No. 11,709,511, which is a continuation of application No. 16/534,058, filed on Aug. 7, 2019, now Pat. No. 11,095,125.

(60) Provisional application No. 62/715,540, filed on Aug. 7, 2018.

(51) Int. Cl.
*G05F 1/12* (2006.01)
*G01R 19/25* (2006.01)
*H01F 27/42* (2006.01)
*H02J 3/00* (2006.01)
*H02J 3/18* (2006.01)
*H02J 50/00* (2016.01)
*H02J 50/10* (2016.01)

(52) U.S. Cl.
CPC ............ *G05F 1/12* (2013.01); *G01R 19/2513* (2013.01); *H01F 27/427* (2013.01); *H02J 3/007* (2020.01); *H02J 3/18* (2013.01); *H02J 50/001* (2020.01); *H02J 50/10* (2016.02)

(58) Field of Classification Search
CPC .... H02J 3/18; H02J 50/10; H02J 3/007; H02J 50/001; H02J 3/005; G01R 19/2513; G05F 1/12; H01F 27/427
See application file for complete search history.

(56) References Cited

U.S. PATENT DOCUMENTS

| 11,095,125 B2 | 8/2021 | Desmarais et al. |
| 2005/0017751 A1 | 1/2005 | Gunn et al. |
| 2010/0084920 A1 | 4/2010 | Banting |
| 2019/0386504 A1 | 12/2019 | Yao |

*Primary Examiner* — Carlos Amaya
(74) *Attorney, Agent, or Firm* — Michael Best & Friedrich LLP

(57) ABSTRACT

An energy harvesting device (CTH) installed in an electrical distribution system (EDS) for powering ancillary electrical devices (AD) used in the distribution system. The device includes a first voltage regulator circuit (CC) configured to produce a voltage matched to a power curve of a current transformer (CT) to which the device is electrically coupled. The device also includes a second and separate voltage regulator circuit (SVR) which continuously operates to maximize the amount of electrical energy recovered from the current transformer.

21 Claims, 1 Drawing Sheet

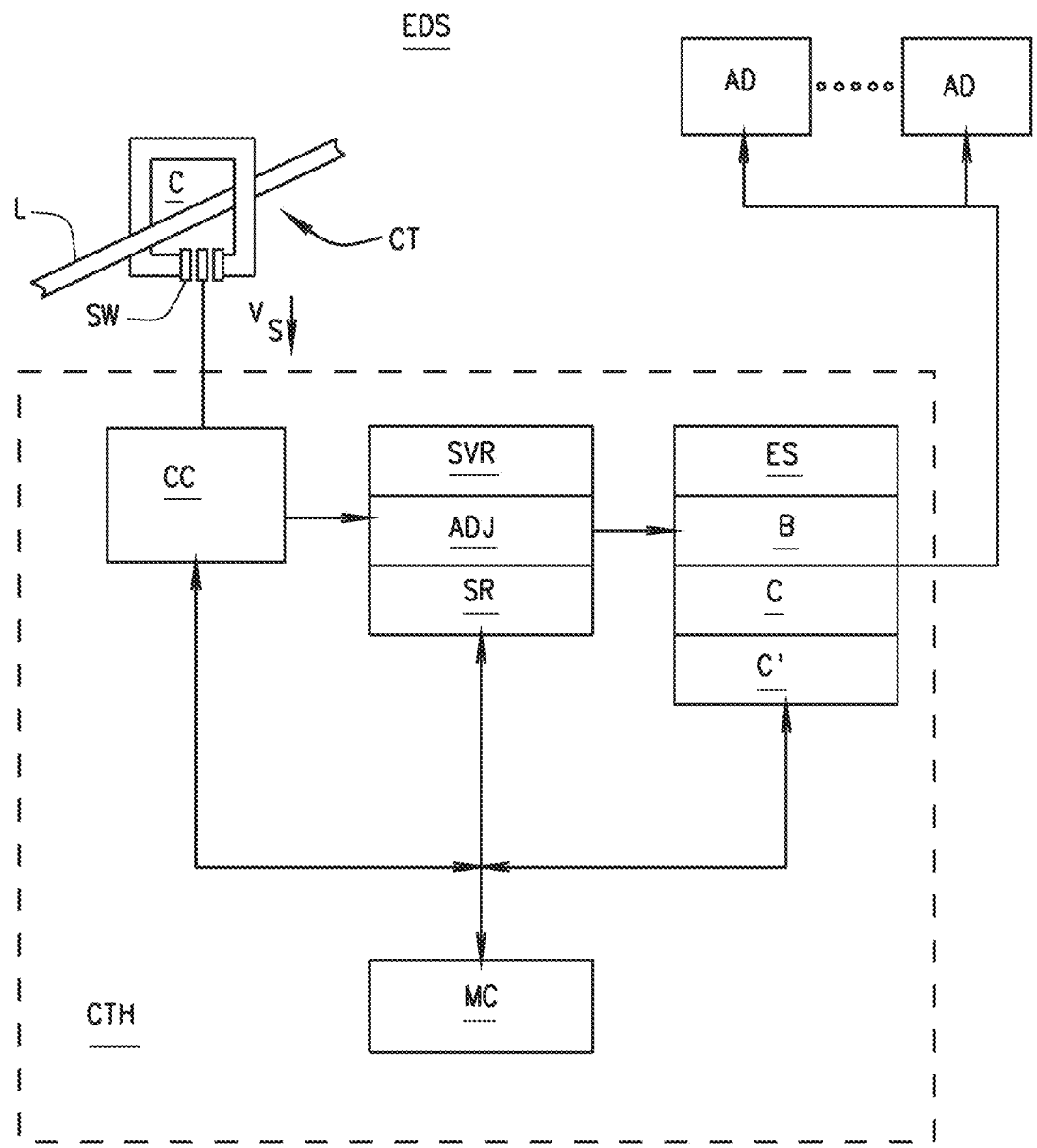

DEVICE AND METHOD FOR HARVESTING ENERGY FROM A POWER LINE MAGNETIC FIELD

REFERENCE TO RELATED APPLICATIONS

This application is a continuation of, and claims priority to, U.S. patent application Ser. No. 17/402,033, filed Aug. 13, 2021, which is a continuation of, and claims the benefit of and priority to, U.S. patent application Ser. No. 16/534, 058, now U.S. Pat. No. 11,095,125, filed Aug. 7, 2019, which claims the benefit of, and priority to, U.S. Provisional Patent Application No. 62/715,540, filed Aug. 7, 2018, the contents of which are hereby incorporated herein in their entirety.

BACKGROUND OF THE INVENTION

This invention relates to the powering of electrical devices associated with an electrical power distribution system; and, more particularly, to the harvesting or recovery of electrical energy from a power line of the distribution system to power the devices.

An electrical distribution system used to generate and supply power to commercial and residential customers now utilizes numerous ancillary devices for metering electrical usage at a site, as well as performing sensing/monitoring, communications, and control functions. These devices require power to operate; however, sources of power for these devices may not be readily available or convenient to access. Previously, the devices have been battery operated, or powered using solar energy, or power obtained by tapping into a transformer of the distribution system.

Because these ancillary devices have proliferated throughout distribution systems, a need has arisen for a reliable, cost-effective source of power to operate them. One solution to this need has been the harvesting or recovering electrical energy from the distribution system itself. This solution involves the use of a current transforming harvester (CTH) that is coupled with an electrical conductor of the distribution system, this being done in such a manner as to not otherwise affect overall operation of the distribution system.

Implementation of a CTH involves use of a current transformer (CT) to capture energy, using magnetic flux, from an electrical conductor to which the CT is electrically coupled. Those skilled in the art will recall that a CT is generally circular in shape and has two halves (referred to as a "split core") which allows the transformer to be electrically connected to an electrical conductor of the distribution network without having to open the circuit with which the conductor is associated. A winding of an electrical wire wraps around a portion of the split core section. Alternating current flowing through the conductor generates a magnetic field around the conductor and through the winding resulting in an induced current in the secondary of the transformer. The CTH includes electrical circuitry that converts the resulting electrical energy into energy used to power one or more of the ancillary electrical devices employed in the distribution system.

In use, it has been found that, often, the voltage on the secondary side of a CT is constrained; i.e., clamped or limited to remain within the maximum operating voltage of capacitors used to store accumulated charge generated by the CTH. It has further been found that using different materials for a transformer's core can result in the secondary side voltage rising to a higher level than is otherwise possible allowing for more energy possibly be recovered.

SUMMARY OF THE INVENTION

The present invention is directed to an energy harvesting device, or CTH, for harvesting electrical energy from an electrical conductor installed in an electrical distribution system in order to power ancillary electrical devices installed throughout the distribution system. The harvesting device utilizes a current transformer having an electrical winding imposed on the electrical conductor for electrical energy to be induced in the winding, by magnetic flux, resulting from alternating current flow through the conductor.

The device includes a voltage regulator circuit configured to receive the induced current and produce a voltage matched to a power curve of the current transformer.

The device also includes a supplemental voltage regulator circuit which continuously operates to maximize or optimize the amount of electrical energy recovered from the secondary side of current transformer. The supplemental voltage regulator does this by periodically adjusting the voltage value at which it clamps so to maximize the amount of power recovered, such adjustments being made in pre-determined steps so to achieve maximum power recovery. The supplemental voltage regulator can also vary a power value sample time based on the stability of the value of line current delivered.

This supplemental voltage regulator converts current recovered at an optimum voltage into power which is then converted into a usable secondary voltage that powers the ancillary devices directly or be stored as charge in a device such as a battery, conventional electrolytic or an electrolytic double layer capacitor.

Other objects and features will be in part apparent and in part pointed hereafter.

DESCRIPTION OF THE DRAWINGS

The sole FIGURE of the drawings is a simplified block diagram of a current transformer and its associated circuitry.

DESCRIPTION OF A PREFERRED EMBODIMENT

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

Referring to the drawing, an electrical distribution system EDS includes a plurality of electrical conductor lines L (only one of which is shown) carrying AC current and through which electricity is propagated throughout the distribution system, all as is well-known in the art. As previously noted, electrical distribution system EDS now includes a number of ancillary devices AD which are used, for example, for sensing or monitoring, system's communications with, and/or control operations at the various facilities to which the distribution system supplies power. As also previously noted, these ancillary devices require power to operate; and, for this purpose, a current transforming harvester CTH is coupled with electrical conductor L of the distribution system.

The harvester CTH utilizes a current transformer CT having a core C and a multi-turn secondary winding SW. Transformer CT may be a split core or solid core transformer with power line L passing through the center of the transformer. The transformer core is made of one of a variety of materials including, for example, silicon steel, alloys with different percentages of nickel, amorphous or a nano-crystalline material, depending on the particular application. Transformer CT includes a multi-turn secondary winding SW the number of turns of which is based on the current required from harvester CTH. As with all current transformers, if the secondary winding is left open, the resulting voltage may rise to too high a value, potentially damaging the secondary windings. Core C and secondary winding SW wrap around power line L in a current transformer configuration with the transformer CT's secondary current being a function of the transformer's primary current divided by the number of turns in the secondary winding, and less any internal magnetization losses.

In operation, the voltage on the secondary side of transformer CT is clamped at a fixed value by an adaptive voltage clamping circuit CC of the CTH which is designed to regulate that voltage to a specific level. In particular, the clamped voltage produced is a function of matching it to a power curve of transformer CT Clamping circuit CC limits this voltage based on a pre-determined voltage level stored in, or commanded by, a microcontroller MC. Further, based on the current value from the CT secondary, circuit CC can produce a clamped output voltage whose value is related to the highest possible voltage, under current EDS operating conditions, while avoiding saturation of transformer CT's core C.

In accordance with the invention, harvester CTH employs a second or supplementary voltage regulator or power conversion circuit SVR which continuously operates to maximize the amount of power recovered from the secondary side of current transformer CT. Circuit SVR frequently adjusts, or readjusts, the clamped voltage value so to maximize the amount of power recovered. Importantly, this feature is especially useful when the power recovered is from a line L that is carrying a small amount of current. The maximum power delivered to circuit SVR facilitates generation of an optimum voltage, given current operating conditions, at a maximum current. Circuit SVR converts the recovered or harvested energy, at the current optimum voltage, into power useful in powering ancillary devices AD, through a switching regulator SR portion of the SVR circuit.

This usable secondary voltage Vs is used to directly power any ancillary devices AD; or, this energy can be stored as electrical charge in an energy storage module ES for later use in powering these devices. This will occur if power subsequently needed to power the ancillary devices becomes unavailable. Module ES includes, for example, a battery B, a conventional single layer electrolytic capacitor C, or a double layer electrolytic capacitor C'. Further, when line L current is high, voltage can be decreased in order to recover power at an acceptable level which can limit the need for the dissipation of excess power as heat.

Adjustments made by circuit SVR are performed in pre-determined steps used to approximate an ideal power recovery point. In this regard, a sample/adjustment circuit ADJ of the SCR varies the sample time by which it adjusts the value of the clamp voltage as a function of the stability of the current level in line L. This is done in response to the voltage and current values as monitored by an analog circuit (not shown) or by microcontroller MC, either of which acts in response to the monitored voltage and current values to modify the voltage regulation point. Usually, small incremental adjustments in the clamping voltage are made by the SVR circuit ADJ in response to inputs from the microcontroller; it being understood that, except for the occurrence of a line fault or other unexpected event, line L current changes relatively slowly. When, however, line L conducts at a much higher current level, the secondary voltage is set to a lower value which, in turn, reduces the amount of power recovered. Microcontroller MC operates to regulate the power recovered to achieve optimal recovery under changing line conditions.

In accordance with the above, in a preferred embodiment a core transformer C with an associated secondary winding SW is connected to a voltage regulator CC affecting a default operational voltage value. This voltage value is modified by an analog voltage or digital value from a microcontroller MC. An analog circuit SVR measures voltage and current and these values as inputs to the microcontroller where this information is used as in input to a control loop. Microcontroller MC also uses the inputs to determine how frequently a harvested voltage and associated current values are read and stored for later use in evaluating operating requirements. Voltage regulator SVR and the measurement circuitry, under control of microcontroller MC, also coordination the measuring of line L current with a minimal load.

In view of the above, it will be seen that the several objects and advantages of the present disclosure have been achieved and other advantageous results have been obtained.

The invention claimed is:

1. An energy harvesting device comprising:
   a current transformer in electrical communication with an electrical conductor and configured to harvest electrical energy from the electrical conductor by converting magnetic flux generated by the flow of alternating current though the electrical conductor into a first current;
   a voltage clamping circuit configured to receive the first current and produce a first voltage at a clamped voltage level;
   a supplementary voltage regulator separate from the voltage clamping circuit, and configured to operate continuously to maximize the harvested electrical energy by adjusting the clamped voltage level.

2. The device of claim 1, wherein the supplementary voltage regulator is configured to adjust the first voltage in one or more pre-determined steps to maximize the amount of electrical energy recovered from the current transformer.

3. The device of claim 2, wherein the one or more predetermined steps approximate an ideal power recovery point.

4. The device of claim 1, further comprising a microcontroller configured to control the supplementary voltage regulator to adjust the clamping voltage level.

5. The device of claim 1, wherein the supplementary voltage regulator includes a switching regulator which converts the first current into a second voltage level configured to power one or more ancillary electrical devices associated with the energy harvesting device.

6. The device of claim 1, further comprising an energy storage device for storing the harvested electrical energy.

7. The device of claim 6, wherein the energy storage device is one or a battery, an electrolytic capacitor, and a double layer electrolytic capacitor.

8. The device of claim 1, wherein the first voltage is matched to a power curve of the current transformer.

9. An electrical distribution system comprising:
   an electrical conductor carrying a first electrical energy having a primary voltage;
   a current transformer in proximity to the electrical conductor and configured to generate a secondary voltage, wherein the secondary voltage is less than the primary voltage;
   one or more ancillary devices;
   an energy harvesting device that provides a second electrical energy to the one or more ancillary devices, wherein the energy harvesting device includes a clamping circuit configured to regulate the secondary voltage to a clamped voltage level; and
   a power maximizing circuit configured to maximize an amount of power derived from the secondary voltage by constantly adjusting the clamped voltage level.

10. The electrical distribution system of claim 9, wherein the one or more ancillary devices perform one or more of, a metering function, monitor operations of the electrical distribution system, record operations of the electrical distribution system, communicate information related to the electrical distribution system and provide control information related to the electrical distribution system.

11. The electrical distribution system of claim 9, wherein the first electrical energy is not diminished by the generation of the secondary voltage.

12. The electrical distribution system of claim 9, wherein the power maximizing circuit is configured to adjust the clamped voltage level in one or more pre-determined steps to maximize the amount of power derived from the secondary voltage.

13. The electrical distribution system of claim 12, wherein the one or more predetermined steps approximate an ideal power recovery point.

14. The electrical distribution system of claim 9, wherein the energy harvesting device further includes a switching regulator, wherein the adjustment of the amplitude of the secondary voltage is performed by the switching regulator.

15. A device for providing electrical energy to one or more ancillary devices of an electrical distribution system, the device comprising:
   a microcontroller;
   a voltage clamping circuit configured to generate a secondary voltage from a current generated by a current transformer and configured to clamp the secondary voltage to a predetermined level to derive an amount of power from the current transformer, wherein the predetermined level is provided by the microcontroller and is based on current operating conditions of the electrical distribution system;
   a secondary voltage regulator that maximizes the amount of power derived from the current transformer by constantly adjusting the amplitude of the secondary voltage to approximate an ideal power recovery point.

16. The energy harvesting device of claim 15, further comprising an energy storage module configured to store at least some of the amount of power derived from the current transformer.

17. The energy harvesting device of claim 15, wherein the secondary voltage regulator adjusts the amplitude of the secondary voltage in predetermined steps.

18. The energy harvesting device of claim 17, wherein the secondary voltage regulator varies a sample time of the secondary voltage as a function of the stability of the electrical current flowing in the electrical distribution system.

19. The energy harvesting device of claim 15, wherein the one or more ancillary devices perform one or more of, a metering function, a sending function, a monitoring function, a communications function and a control function.

20. The energy harvesting device of claim 15, wherein the secondary voltage directly powers the one or more ancillary devices.

21. The device of claim 15, wherein the secondary voltage regulator includes a switching regulator configured to adjust the amplitude of the secondary voltage.

* * * * *